United States Patent [19]
Alexandres et al.

[11] Patent Number: 5,223,690
[45] Date of Patent: Jun. 29, 1993

[54] PROCESS AND APPARATUS FOR SPOT-WELDING A FLEXIBLE WELDING BOARD TO A BATTERY CELL

[75] Inventors: Richard B. Alexandres, Clear Lake; George W. Villeponteaux, Mason City, both of Iowa

[73] Assignee: Alexander Manufacturing Company, Mason City, Iowa

[21] Appl. No.: 886,866

[22] Filed: May 22, 1992

Related U.S. Application Data

[63] Continuation-in-part of Ser. No. 619,520, Nov. 29, 1990.

[51] Int. Cl.⁵ .............................................. B23K 11/10
[52] U.S. Cl. ...................... 219/86.1; 29/623.1; 228/901
[58] Field of Search .......... 219/86.9, 87, 86.1, 219/108, 111, 112; 228/58, 901; 429/121, 122, 186; 29/623.1, 623.3, 623.4

[56] References Cited

U.S. PATENT DOCUMENTS

| | | | |
|---|---|---|---|
| 2,667,526 | 1/1954 | Stumbock | 29/623.1 |
| 3,339,169 | 8/1967 | Freeland | 429/121 |
| 3,558,848 | 1/1971 | Width | 219/87 |
| 4,069,079 | 1/1978 | Eggert | 29/623.4 |
| 4,253,232 | 3/1981 | Bennett et al. | 29/623.1 |
| 4,778,479 | 10/1988 | Römling et al. | 29/623.1 |
| 4,920,019 | 4/1990 | Stoklosa et al. | 429/122 |

FOREIGN PATENT DOCUMENTS

| | | | |
|---|---|---|---|
| 57-154760 | 9/1982 | Japan | 29/623.1 |
| 58-103775 | 6/1983 | Japan | 29/623.1 |
| 1488116 | 10/1977 | United Kingdom | 29/623.1 |

*Primary Examiner*—Geoffrey S. Evans
*Attorney, Agent, or Firm*—Hugh D. Jaeger

[57] ABSTRACT

Process for spot-welding a flexible bare backed welding board to at least one and preferably a plurality battery cells to form a battery pack, such as a NiCad battery pack. The flexible bare backed welding board is a nickel or other metal alloy material, laminated to a polyester film by a co-extruded or otherwise applied adhesive. The spot-welding is accomplished by one spot-welder, and preferably two spot-welders, which spot-weld in alternating time intervals so as to assure electrical and electromechanical contact with each end of the battery cells by the nickel alloy material. The spot-welding is by DC current and voltage or alternatively can be AC welded. The electrodes are small enough to form a configuration between the flexible circuit and the end of the battery cell. Three spot-welding electrodes would assume a triangular configuration. Four spot-welding electrodes would form a rectangular configuration.

14 Claims, 3 Drawing Sheets

PROCESS AND APPARATUS FOR SPOT-WELDING A FLEXIBLE WELDING BOARD TO A BATTERY CELL

CROSS REFERENCES TO CO-PENDING APPLICATIONS

This Application is a continuation-in-part of U.S. Ser. No. 07/619,520, filed Nov. 29, 1990, entitled "Process for Spot-Welding a Flexible Welding Board to a Battery Cell."

BACKGROUND OF THE INVENTION

1. Field of the Invention

The present invention is for spot-welding, and more particularly, pertains to spot-welding of a nickel alloy or other alloy or metal have backed flexible welding board to battery cells.

2. Description of the Prior Art

Battery packs, such as NiCad battery packs in the past have been manufactured by welding stainless steel straps or nickel straps between battery cells, which is expensive in tie and motion by an individual, requiring the individual welding of each battery cell for connection by stainless steel straps or nickel straps.

The present invention overcomes the disadvantages of the prior art by providing a flexible bare backed welding board which, can be spot-welded directly to the battery cells, and particularly, lends itself to robotic manufacturing processes.

SUMMARY OF THE INVENTION

The general purpose of the present invention is spot-welding a flexible bare backed welding board to battery cells to form a battery pack. Other electrical components or electromechanical components can also be spot-welded to the flexible welding bare backed board. The term "bare backed" refers to the feature of having access to the back of the circuit trace by means of the holes punched through the polyester substrate.

According to one embodiment of the present invention, there is provided an automated process for spot-welding a flexible bare backed welding board to battery cells, including at least two spot-welders for alternately welding, at least two different locations, each end of a battery cell to a flexible bare backed welding board, assuring electrical and electromechanical weld integrity. In one example, the battery cell and welding bare backed board are spot-welded by a triangular configuration of a negative electrode and two positive electrodes, each of the positive electrodes connected to independent sources of welding power and energized independently of each other for assurance of separate welds. This provides that there are two separate spot-welds and also provides for the integrity of each of the spot-welds.

Significant aspects and features of the present invention include a process for spot-welding, particularly for spot-welding a nickel or other metal alloy or metal flexible bare backed welding board to a plurality of battery cells. The process is particularly and ideally suited for automated manufacturing of battery packs.

Another significant aspect and feature of the present invention is a process for spot-welding a flexible welding board to a battery cell, which is completely automated to expedite the manufacturing of battery packs.

Having thus described the embodiments of the present invention, it is a principle object hereof to provide a process and apparatus for spot-welding a flexible bare backed welding board to battery cells to form a battery pack, such as a battery pack.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
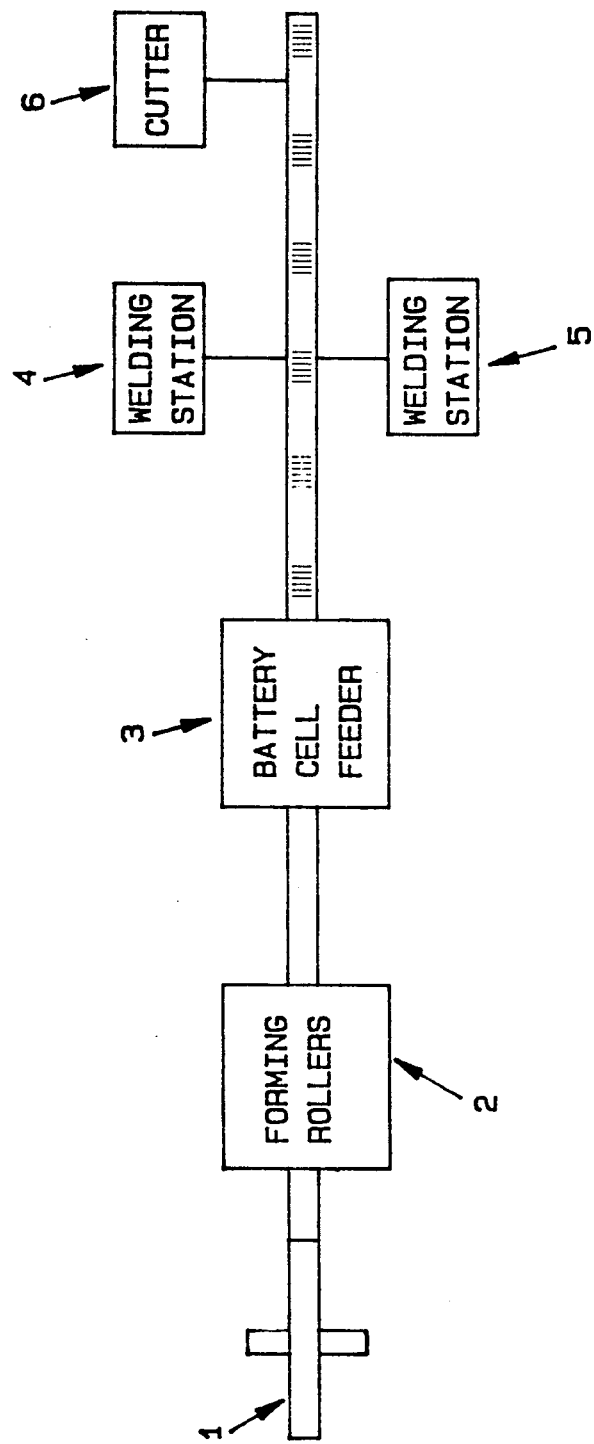
FIG. 1 illustrates a top view of a process and apparatus for spot-welding a flexible welding board to a battery cell.

FIG. 1 illustrates an apparatus for and a process of spot-welding a flexible bare backed welding board to battery cells to form a batter pack. While the process is intended to weld a plurality of battery cells to form a battery pack any suitable number of cells and types of cells other than NiCad can be utilized in the process. Prepunched holes in the flexible bare backed welding board geometrically conforms to the battery cells prior to welding the electrical contact portion of teach cell to the flexible welding board. At least two spot welds are utilized, although any other type of industrial welding could e utilized, other than spot-welding, such as laser welding, electron beam welding, etc. The process of welding the flexible bare backed board to battery cells is intended for welding either a single flexible bare backed welding board about at least one or a plurality of cells, or for use in robotic welding applications.

Figure 3:
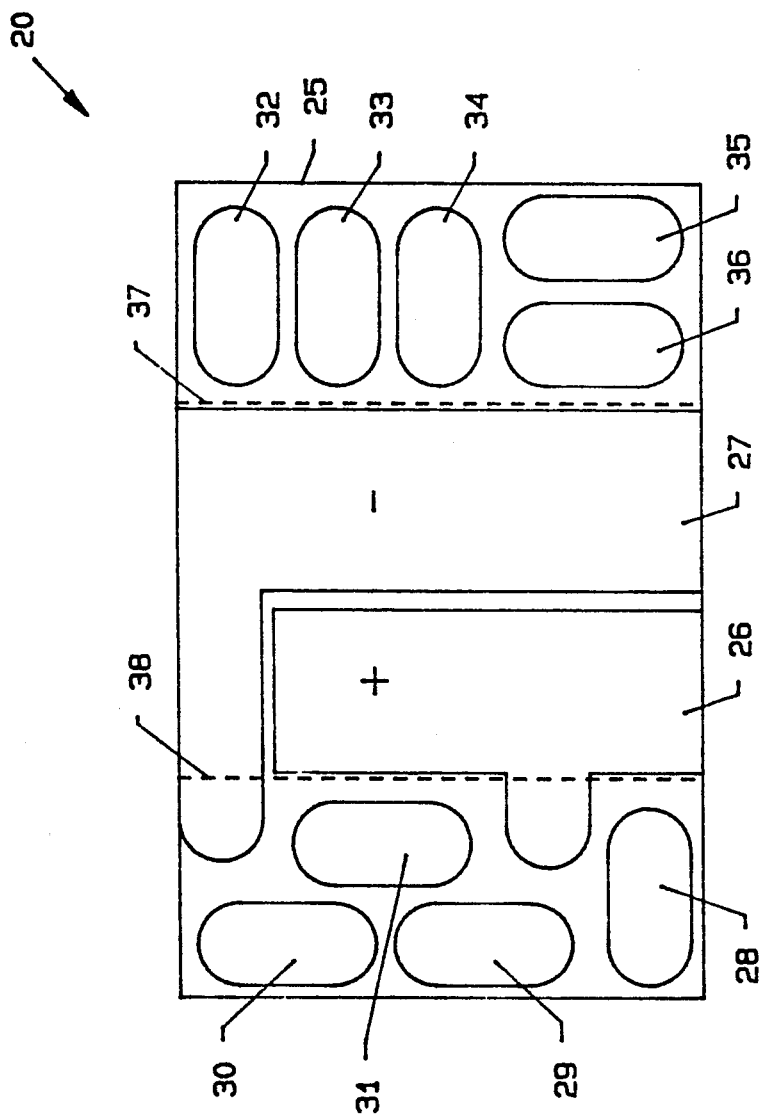

As illustrated on a robotic application, a continuous coil of flexible welding boards, formed as will be described in later detail with reference to FIG. 3, is pulled through driven forming rollers 2. The forming rollers 2 convert the flat flexible welding board into a U-shaped configuration with the legs of the U facing upwards as viewed from above in FIG. 1. The formed flexible welding board 1 then passes underneath a battery cell feeder 3. The battery cell feeder 3 deposits the desired number of cells 19 arranged and suitably bonded together, such as by hot glue or adhesive, between the legs of the formed flexible welding board 1 with the terminals facing up and down as viewed in FIG. 1. The formed flexible welding board and battery cells 19 move to welding stations 4 and 5 where the nickel alloy or other metal alloy or metal straps and pads, as shown in FIG. 3, are spot-welded to each of the terminal's of the battery cells, forming a battery pack. The battery pack passes to a cutter 6 where each individual battery pack is separated from the now 10 continuous formed strip.

Figure 2:
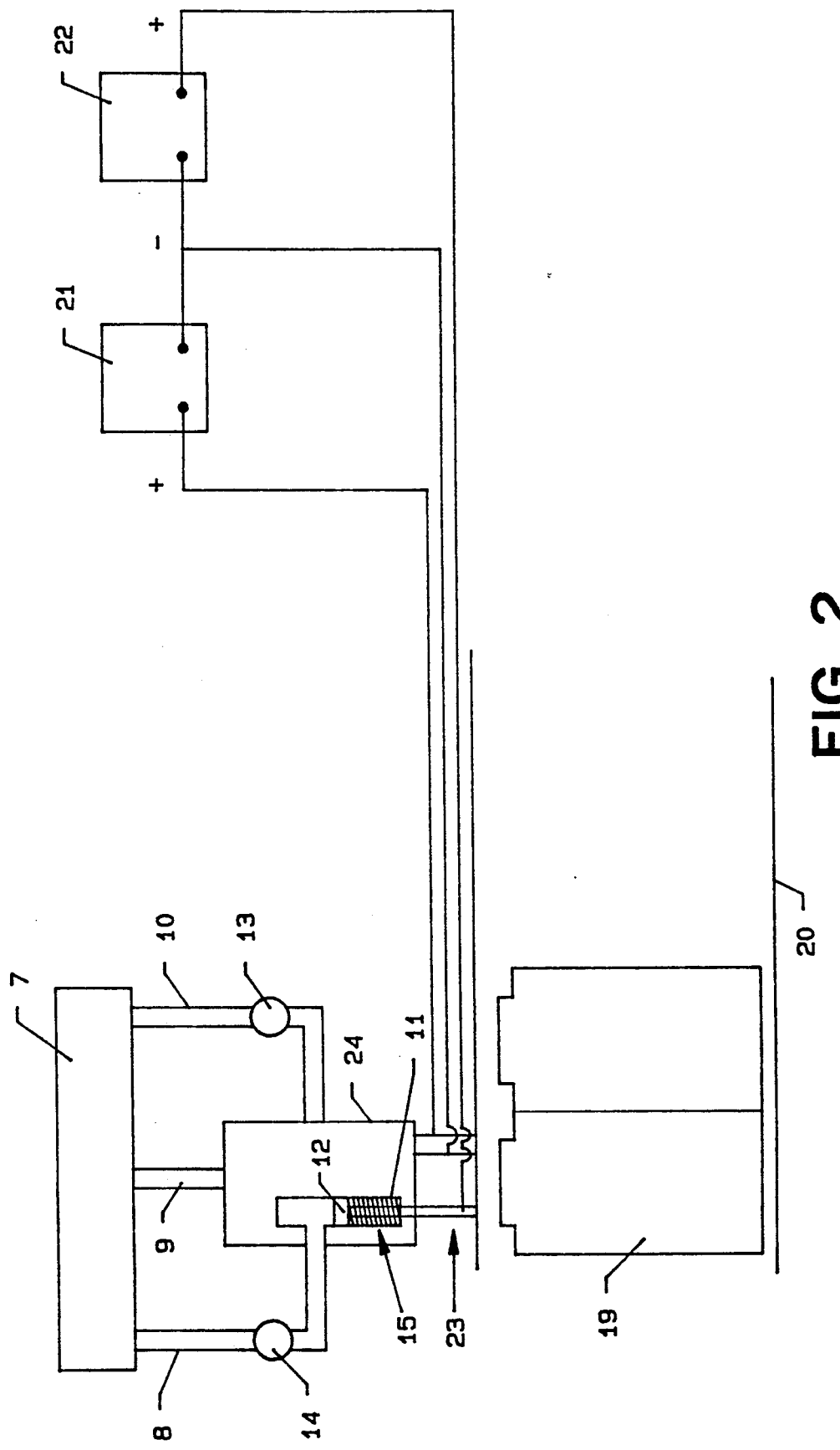
FIG. 2 illustrates an enlarged view of one of the spot welders showing details thereof; and, FIG. 3 illustrates a top view of a flexible welding board formed according to the invention.

FIG. 2 illustrates in greater detail one of the welding stations 4 and 5 shown in FIG. 1. The welding station consists of a fluid pressure source 7 which supplies pressure over lines 8, 9, and 10 through electric valves 13 and 14 and a third valve in supply line 9 not illustrated. Supply lines 8, 9 and 10 connect to three cylinders 11, only one being illustrated, formed in a housing 24. The cylinders 11 are electrically insulated each from the other. Within each cylinder is a piston 12 to which is connected a spot welding electrode 23. A spring 15, below the piston 12, functions to return electrode 23 upon release of pressure by valves in the supply lines 8, 9 and 10. Separate isolated power sources 21 and 22 have their negative terminals commonly connected, and then connect to each one of the welding electrodes. High frequency welding or other welding methods can also be incorporated. The positive terminals are connected to the remaining two spot-welding electrodes. The electrodes are arranged in a triangular configuration, although other geometrical configurations can be utilized as contemplated. The electrodes can be energized in pairs or simultaneously as desired. The spot welder system, as illustrated, will provide three distinct spot welds, insuring both mechanical and electrical integrity.

FIG. 3 is a top view of a flexible bare backed board as generically contemplated by the teachings of the present invention. As illustrated, a flexible polyester sheet 25 is co-extruded with a polymer adhesive or like material on one surface thereof or can be otherwise adhesively attached. Nickel alloys or other metal alloy or metal contact pads 26 and 27 and nickel alloy or other metal alloy battery or metal interconnecting straps 28-36, suitably dimensioned and configured, are then adhesively formed on the flexible bare backed polyester sheet. One preferred process is to etch the foil patterns by known processes after the nickel alloy or other metal alloy has been laminated to the polyester film. Prior to forming the nickel alloy or other metal alloy pads and straps, the flexible polyester sheet 25 is provided with apertures at locations coextensive with the pads and straps to provide for welding the nickel alloys or other metal alloy material to the battery terminals.

The robotic process includes forming rollers 2, as shown in FIG. 1, which fold the configuration of FIG. 3 along the lines 37 and 38 into an U-shape, which shape is retained by the nickel alloy material. A plurality of cells can now be placed between the legs of the U-shape as by battery cell feeder 3, and bonded by welding stations 4 and 5. The configuration shown in FIG. 3 is suitable for forming a ten cell battery pack. As contemplated by the present invention, the flexible polyester sheet 25 is a continuous sheet with multiple configurations of pads and straps laminated to the sheet to permit continuous processing. The completed battery pack would consist of ten cells horizontally disposed between the lines 37 and 38 as shown in FIG. 3. When the circuit board is folded out of the plane of the paper along the lines 37 and 38, as shown in FIG. 3, the contact portions 28-36 engage the terminals at the opposite ends of the batteries to electrically interconnect the batteries.

Although a preferred embodiment of the present 30 invention has been disclosed, numerous modifications are possible within the scope of the invention. For example, the forming rollers could be replaced by other forming structure. The flexible bare backed welding board and battery cells can be moved continuously along the processing line, and welded by flying spot welders or indexed along the processing line welded by spot welders which need only be moved to accommodate stacked cells. While fluid cylinders are disclosed to activate the welding electrodes, other structure is possible such as magnetic actuators. The spot welding power supplies can be of any suitable type. The flexible welding board shown in FIG. 3 shows only pads and straps for interconnecting battery cells. It is contemplated that other electrical or electromechanical circuit elements, such as switches, resistors, capacitors, diodes, thermistors, thermal switches, contacts, etc. can be connected to the nickel or other metal alloy and even adhesively secured to the polyester film as may be required.

Various modifications can be made to the present invention without departing from the apparent scope hereof.

We claim:

1. Process for spot welding a flexible welding board to at least one battery cell having terminals at opposite ends of said at least one cell comprising the steps of:
   a. providing a flexible substrate;
   b. forming holes in said substrate;
   c. forming an electrical circuitry pattern on said substrate with portions of said electrical circuit pattern overlying said holes;
   d. forming said substrate and circuit pattern into a U shape;
   e. orienting at least one battery cell within the legs of the U shape so as to contact said portion of the circuit pattern overlying the holes with the terminals at the opposite ends of said at least one battery cell; and,
   f. spot welding said electrical circuit pattern to said terminals.

2. The process of claim 1 comprising spot welding a plurality of battery cells to said circuit pattern.

3. The process of claim 1 comprising engaging the circuit pattern and battery cell terminals through insertion of welding electrodes into the holes in said substrate.

4. The process of claim 1 wherein the substrate is continuous and discrete circuit patterns are formed on said continuous substrate.

5. The process of claim 4 comprising separating the welded circuit pattern and its substrate from the continuous substrate.

6. Apparatus for manufacturing a battery pack comprising:
   a. means for supplying flexible welding boards comprising a substrate having holes punched therein and circuit patterns formed thereon with portions of said circuit patterns overlying said holes;
   b. means for forming said welding boards into a U-shaped configuration;
   c. means for supplying a battery pack of at least one battery cell having terminals at opposite ends of said at least one cell between the legs of one of the U-shaped welding boards; and,
   d. means for spot welding said portions of the circuit pattern overlying the holes to the terminals of said at least one battery cell.

7. The apparatus of claim 6 wherein the means for supplying supplies a battery pack for enclosing a plurality of battery cells.

8. The apparatus of claim 6 wherein the means for forming aligns said portions of the circuit patterns overlying said holes with the terminals of said at least one cell.

9. The apparatus of claim 6 wherein the means for spot welding is a resistance welder having at least two electrodes.

10. The apparatus of claim 6 wherein the means for spot welding is a resistance welder having three electrodes arranged in a triangular configuration.

11. The apparatus of claim 6 wherein the means for supplying supplies discrete welding boards in a continuous strip.

12. The apparatus of claim 11 further comprising means for separating individual welding boards.

13. The apparatus of claim 10 wherein the electrodes are supplied from means including two power sources having two of the like polarity terminals interconnected.

14. The apparatus of claim 13 including means connecting the interconnected terminals to one of the electrodes and means connecting the other two electrodes to the two remaining terminals of said power sources.

* * * * *